(12) United States Patent
Lee et al.

(10) Patent No.: US 8,982,604 B2
(45) Date of Patent: Mar. 17, 2015

(54) RESISTIVE MEMORY DEVICE AND MEMORY APPARATUS AND DATA PROCESSING SYSTEM HAVING THE SAME

(71) Applicant: SK Hynix Inc., Gyeonggi-do (KR)

(72) Inventors: Keun Lee, Gyeonggi-do (KR); Se Hun Kang, Gyeonggi-do (KR); Ja Chun Ku, Gyeonggi-do (KR); Kwon Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 122 days.

(21) Appl. No.: 13/746,625

(22) Filed: Jan. 22, 2013

(65) Prior Publication Data

US 2013/0336042 A1 Dec. 19, 2013

(30) Foreign Application Priority Data

Jun. 19, 2012 (KR) ........................ 10-2012-0065800

(51) Int. Cl.
*G11C 11/00* (2006.01)
*H01L 45/00* (2006.01)
*G11C 13/00* (2006.01)

(52) U.S. Cl.
CPC ........ *H01L 45/1253* (2013.01); *G11C 13/0002* (2013.01); *H01L 45/06* (2013.01); *H01L 45/1226* (2013.01); *H01L 45/1233* (2013.01); *H01L 45/1246* (2013.01); *H01L 45/126* (2013.01); *H01L 45/143* (2013.01); *H01L 45/144* (2013.01); *H01L 45/148* (2013.01); *G11C 13/0004* (2013.01)
USPC ..................... 365/148; 365/163; 257/2; 257/4

(58) Field of Classification Search
CPC .................................................. H01L 45/1253
USPC .................................... 365/148, 163; 257/2, 4
See application file for complete search history.

(56) References Cited

U.S. PATENT DOCUMENTS

| | | | | |
|---|---|---|---|---|
| 3,801,966 A * | 4/1974 | Terao | ............................. | 365/113 |
| 6,423,621 B2 * | 7/2002 | Doan et al. | .................... | 438/597 |
| 7,151,273 B2 * | 12/2006 | Campbell et al. | ................. | 257/3 |
| 7,462,900 B2 * | 12/2008 | Hideki et al. | ................. | 257/300 |
| 7,704,787 B2 * | 4/2010 | Hideki et al. | ................. | 438/102 |
| 8,039,372 B2 * | 10/2011 | Min et al. | ...................... | 438/482 |
| 8,283,711 B2 * | 10/2012 | Jin et al. | ........................ | 257/295 |
| 8,467,236 B2 * | 6/2013 | Campbell | ...................... | 365/159 |
| 8,710,482 B2 * | 4/2014 | Yasuda et al. | ...................... | 257/4 |
| 8,735,860 B2 * | 5/2014 | Park et al. | ......................... | 257/2 |
| 2013/0105756 A1 * | 5/2013 | Kim | .................................. | 257/2 |
| 2013/0141967 A1 * | 6/2013 | Cho et al. | ...................... | 365/163 |

FOREIGN PATENT DOCUMENTS

| KR | 100687757 | 2/2007 |
|---|---|---|
| KR | 100858089 | 9/2008 |
| KR | 1020100041139 | 9/2008 |
| KR | 1020100137577 | 12/2010 |
| KR | 1020110022249 | 3/2011 |

* cited by examiner

*Primary Examiner* — Viet Q Nguyen
(74) *Attorney, Agent, or Firm* — IP & T Group LLP

(57) ABSTRACT

A resistive memory device operable with low power consumption and a memory apparatus and data processing system including the same are provided. The resistive memory includes a chalcogenide compound containing 10 to 60 wt % (atomic weight) of selenium (Se) or tellurium (Te).

39 Claims, 6 Drawing Sheets

RESISTIVE MEMORY DEVICE AND MEMORY APPARATUS AND DATA PROCESSING SYSTEM HAVING THE SAME

CROSS-REFERENCES TO RELATED APPLICATION

This application claims priority under 35 U.S.C. 119(a) to Korean application number 10-2012-0065800, filed on Jun. 19, 2012, in the Korean Patent Office, which is incorporated by reference in its entirety.

BACKGROUND OF THE INVENTION

1. Technical Field

The inventive concept relates to a semiconductor integrated device, and more particularly, to a resistive memory device, a memory apparatus and a data process'ng system having the same.

2. Related Art

Resistive memory devices use a variable resistive material that switches between at least two different resistance states by a rapid resistance change based on an applied voltage. Resistive memory devices have received attention as next-generation memories that can replace dynamic random access memories (DRAMs) or flash memories.

Phase-change memory devices are an example of a resistive memory device. In general, a phase-change memory device includes an access device, a lower electrode formed on the access device, a variable resistive material formed on the lower electrode, and an upper electrode formed on the variable resistive material.

The phase-change memory device stores data by changing a crystalline state of the variable resistive material when current is applied to the lower electrode. The variable resistive material has a low resistance when in a crystalline state and a high resistive when in an amorphous state.

FIG. 1 is view illustrating a structure of a general phase-change memory device.

As shown in FIG. 1, the general phase-change memory device includes an access device 11, a lower electrode 13, a variable resistive material layer 15, and an upper electrode 17 and is fabricated in a confined structure due to increase in a reduction rate. The reference numeral 19 is an insulating layer.

The variable resistive material layer 15 may be formed using germanium-antimony-tellurium ($Ge_2Sb_2Te_5$; "GST"). Even though GST is widely used as the typical variable resistive material, a transition speed between the crystalline state and the amorphous state is low and thus, overall operation speed of the memory device is lowered. Further, GST has a high melting temperature and thus, high reset current is necessary.

Therefore, there is a need for a memory device using a variable resistive material having a fast transition speed and a low reset current.

SUMMARY

According to one aspect of a first exemplary embodiment, there is provided a resistive memory device. The resistive memory device may include: a lower electrode electrically connected to an access device; a data storage node heated by the lower electrode and including a chalcogenide compound in which an atomic weight of selenium (Se) or tellurium (Te) is 10 to 60%, and an upper electrode connected to the data storage node.

According to another aspect of a second exemplary embodiment, there is provided a resistive memory device. The resistive memory device may include: a data storage node including variable resistive material layers stacked at least twice with insulating layers interposed therebetween, at least one of the variable resistive material layers formed of a chalcogenide compound in which an atomic weight of selenium (Se) or tellurium (Te) is 10 to 60%; a lower electrode formed to surround the insulating layers and the variable resistive material layers in one sidewall of the data storage node; and an upper electrode formed to surround the insulating layers and the variable resistive material layers in the other sidewall of the data storage node.

According to another aspect of a third exemplary embodiment, there is provided a resistive memory device. The resistive memory device may include: a data storage node including variable resistive material layers stacked at least twice with insulating layers interposed therebetween, at least one of the variable resistive material layers formed of a chalcogenide compound in which an atomic weight of selenium (Se) or tellurium (Te) is 10 to 60%, a lower electrode electrically connected to the variable resistive material layers in one sidewall of the data storage node; and an upper electrode formed to surround the insulating layers and the variable resistive material layers in the other sidewall of the data storage node.

According to another aspect of a fourth exemplary embodiment, there is provided a resistive memory device. The resistive memory device may include: a first lower electrode; a second lower electrode formed on the first lower electrode and including a via hole formed in a direction of the first lower electrode; a first variable resistive material layer buried within the via hole; a second variable resistive material layer formed on the second lower electrode and the first variable resistive material layer; and an upper electrode formed on the second variable resistive material layer. At least one of the first variable resistive material layer and the second variable resistive material layer may be formed of a chalcogenide compound in which an atomic weight of selenium (Se) or tellurium (Te) is 10 to 50%.

According to another aspect of a fifth exemplary embodiment, there is provided a resistive memory device. The resistive memory device may include: a first lower electrode; a second lower electrode formed to have predetermined width and height on a periphery of the first lower electrode; a first variable resistive material layer buried in an inner circumference of the second lower electrode; a second variable resistive material layer formed on the second lower electrode and the first variable resistive material layer to be electrically connected to the second lower electrode and the first variable resistive material layer; and an upper electrode formed on the second variable resistive material layer. At least one of the first variable resistive material layer and the second variable resistive material layer may be formed of a chalcogenide compound in which an atomic weight of selenium (Se) or tellurium (Te) is 10 to 60%.

According to another aspect of an exemplary embodiment, there is provided a memory apparatus. The memory apparatus may include: a memory cell array including a plurality of memory cells connected between word lines and bit lines; and a controller configured to control data read and write for a selected memory cell among the memory cell array. Each of the plurality of memory cells may be a resistive memory device including at least one variable resistive material layer. At least one of variable resistive material layers may be formed of a chalcogenide compound in which an atomic weight of selenium (Se) or tellurium (Te) is 10 to 60%.

According to another aspect of an exemplary embodiment, there is provided a data processing system. The data processing system may include: a resistive memory apparatus; and a memory controller configured to access the resistive memory apparatus in response to request of a host. The resistive memory apparatus may include a memory cell array in which resistive memory devices are connected between bit lines and word lines; and a controller configured to control an operation of the memory cell array. Each of the resistive memory devices may be a resistive memory device including at least one variable resistive material layer. At least one of variable resistive material layers may include a chalcogenide compound in which an atomic weight of selenium (Se) or tellurium (Te) is 10 to 60%.

According to another aspect of an exemplary embodiment, there is provided a data processing system. The data processing system may include: a processor configured to control an overall operation; an operation memory in which an application, data, and a control signal required for an operation of the processor are stored; a resistive memory apparatus accessed by the processor; and a user interface configured to perform data input and output between the processor and a user. The resistive memory apparatus may include a memory cell array in which resistive memory devices are connected between bit lines and word lines; and a controller configured to control an operation of the memory cell array. Each of the resistive memory devices may be a resistive memory device including at least one variable resistive material layer. At least one of variable resistive material layers may be a chalcogenide compound in which an atomic weight of selenium (Se) or tellurium (Te) is 10 to 60%.

These and other features aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings.

DETAILED DESCRIPTION

Figure 1:
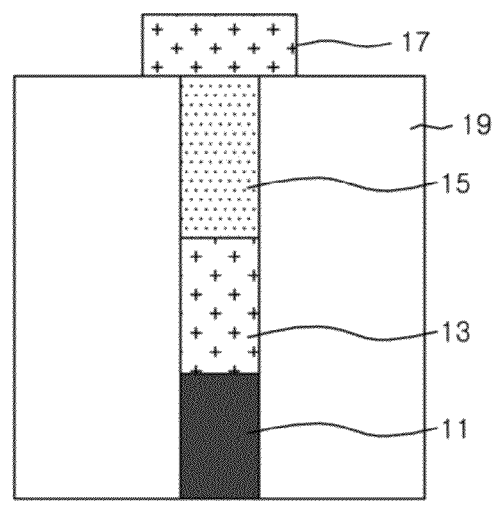
FIG. 1 illustrates a structure of a general phase-change memory device.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

A chalcogenide compound used as a variable resistive material in a resistive memory device is composed of at least one chalcogenide element and at least one electric electropositive element. Some chalcogenide compounds are stable at a room temperature all in an amorphous state and a crystalline state. Thus, chalcogenide compounds are widely used as the variable resistive material of the resistive memory device.

Selenium (Se) and tellurium (Te) are chalcogenide elements and have a relatively low melting point and thermal conductivity. Accordingly, in the inventive concept, a material containing Se or Te of about 10 to about 60 wt % (weight percent) is proposed as the variable resistive material layer of the resistive memory device.

Figure 2:
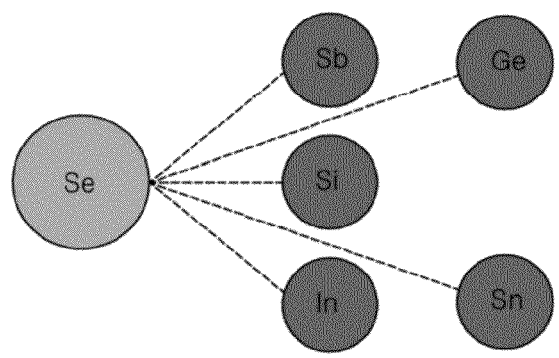
FIGS. 2 and 3 illustrate a variable resistive material according to an exemplary embodiment.
Figure 3:
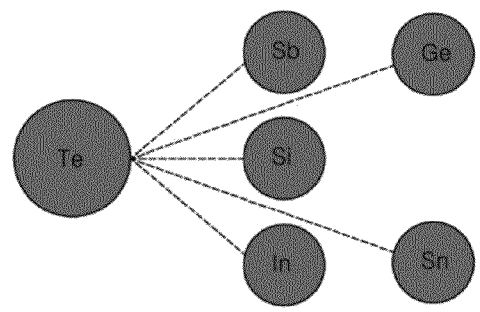

FIGS. 2 and 3 illustrate a variable resistive material according an exemplary embodiment.

First, FIG. 2 is a schematic diagram illustrating an example of a compound including Selenium (Se).

Selenium (Se) may be combined with antimony (Sb), germanium (Ge), Silicon (Si), tin (S) or indium (In) to form a binary metal alloy. Further, selenium (Se) may be combined with any two of antimony (Sb), germanium (Ge), Silicon (Si), tin (Sn), or indium (In) to form a ternary metal alloy.

In particular, Sn—Sb—Se and Ge—Sb—Se, among the metal alloys containing selenium (Se, haven low power consumption, a low reset current, a fast transition speed to enable high speed operation, and a good thermal stability.

An Sb-rich or an Sn—Sb—Se layer may be formed by increasing an amount of Sb in a variable resistive material layer including Sn—Sb—Se. In the Sb rich Sn—Sb—Se layer, the content of Sn may be in a range of about 1.0 to about 25.5 wt %, the content of Sb may be in a range of about 10 to about 90 wt %, and the content of Se may be in a range of about 10 to about 60 wt %.

Alternatively, an Sb-rich Ge—Sb—Se layer may be formed by increasing an amount of Sb in a variable resistive layer including Ge—Sb—Se. In the Ge—Sb—Se layer, the content of Ge may be in a range of about 1.0 to about 25.5 wt %, the content of Sb may be in a range of about 10 to about 90 wt %, and the content of Se may be in a range of about 10 to about 60 wt %.

FIG. 3 is a schematic diagram illustrating an example of a compound containing tellurium (Te).

Tellurium (Te) may be combined with antimony (Sb), germanium (Ge), Silicon (Si), tin (Sn), or indium (In) to form a binary metal alloy. Further, Tellurium (Te) may be combined with any two of antimony (Sb) germanium (Ge), Silicon (Si), tin (Sn), or indium (In) to form a ternary metal alloy. Further, selenium (Se) may be combined with any two elements of antimony (Sb), germanium (Ge), Silicon (Si), tin (Sn), or indium (In) to form a ternary metal alloy.

In particular, Sn—Sb—Te, among the metal alloys containing tellurium (Te), has low power consumption a low reset current, fast transition speed to enable high speed operation, and a good thermal stability.

The Sb-rich Sn—Sb—Te layer may be formed by increasing an amount of Sb in a variable resistive material layer including Sn—Sb—Te. In the Sb rich Sn—Sb—Te layer, the content of Sn may be in a range of about 1.0 to about 25.5 wt %, the content of Sb may be in a range of about 10 to about 90 wt %, and the content of Te may be in a range of about 10 to about 60 wt %.

Alternatively, a Sb-rich Si—Sb—Te layer may be formed by increasing an amount of Sb in a variable resistive layer including Si—Sb—Te. In the Sb rich Si—Sb—Te layer, the content of Si may be in a range of about 1.0 to about 25.5 wt %, the content of Sb may be in a range of about 10 to about 90 wt %, and the content of Te may be in a range of about 10 to about 60 wt %.

Figure 4:
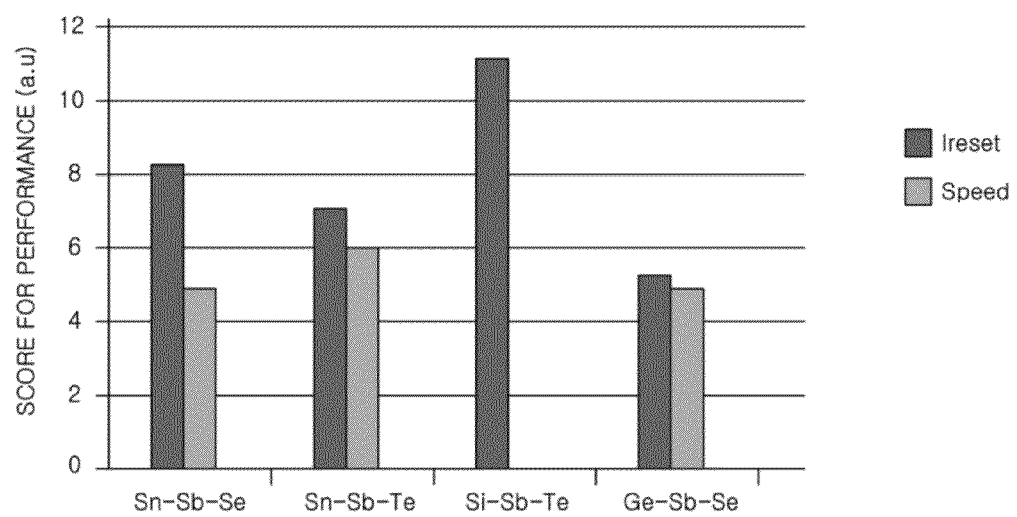
FIGS. 4 and 5 illustrate characteristics of a variable resistive according to an exemplary embodiment.
Figure 5:
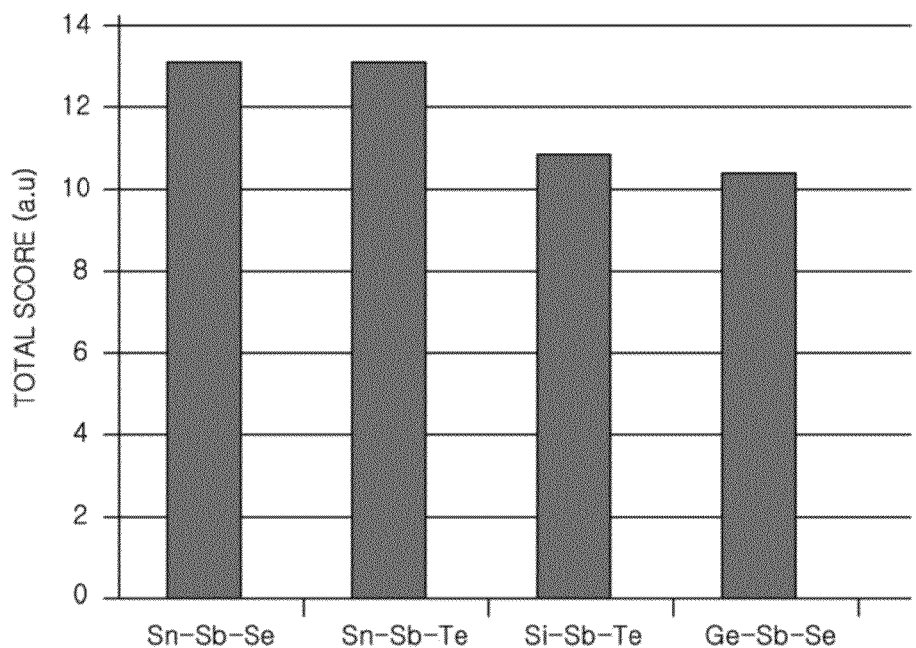

FIGS. 4 and 5 are graphs explaining characteristics of exemplary variable resistive material.

FIG. 4 is a graph representing a reset current (Ireset) and speed of metal alloy containing Se and Te.

It can be seen from FIG. 4 that Si—Sb—Te has a relatively low speed, which cannot be measured its speed performance, but has excellent characteristic in terms of the reset current. It can be seen that Sn—Sb—Se, Sn—Sb—Te, and Ge—Sb—Se get a speed score of at least five or more.

Ge—Sb—Te (GST), which is a general variable resistive material, has a performance score of about five in the reset current. Meanwhile, it can be seen that the exemplary variable resistive materials, which contain about 10 to about 60 wt % Ge or Te, have reset current characteristics that are better than those of GST.

In terms of speed performance, it can be seen that Sn—Sb—Se, Sn—Sb—Te, and Ge—Sb—Se get a score of 5 more for speed performance, as compared to GST, which has a score of about 5 for speed performance. It can be seen that the exemplary variable resistive materials have a better speed performance than does GST, while having good reset current characteristics.

FIG. 5 illustrates a total score derived by summing the Ireset and speed scores shown in FIG. 4.

For example, GST has an Ireset score of about 5 and a speed performance score of about 5. Therefore, the total score is about 10. In contrast, FIG. 5 shows that all of the exemplary variable resistive materials, which contain about 10 to about 60 wt % Se or Te, have a total score above 10. That is, the exemplary variable resistive materials exhibit reduced reset current to lower and power consumption, and increased operation.

Recently, a multi-level cell (MLC)-type semiconductor memory device has been developed that stores three, or more, pieces of information in one memory cell. To provide a MLC-type resistive memory device, it is important to distinctly divide the resistance state of the variable resistive material. Further, as a degree of integration increases, a possibility for disturbances between adjacent cells has increased.

The exemplary variable resistive material containing about 10 to about 60 wt % Se or Te has an excellent thermal stability. Therefore, a resistive memory device using the exemplary variable resistive material is suitable for implementation in an MLC-type resistive memory device and can result in highly integrated a memory array without the disturbances between adjacent memory cells.

Figure 6:
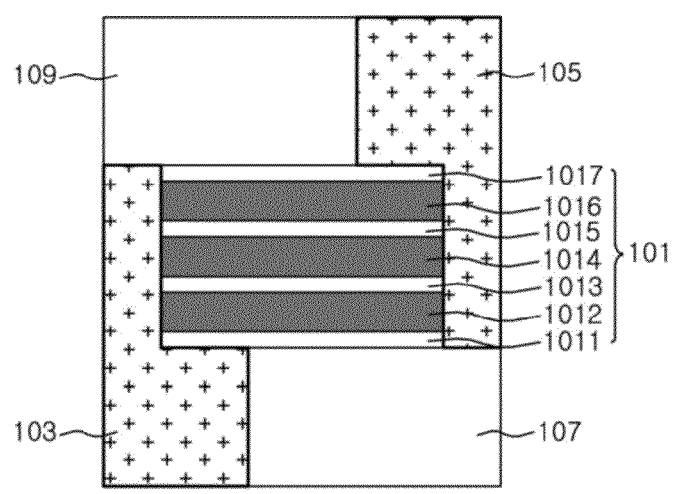
FIG. 6 illustrates a structure of a resistive memory device according to an exemplary embodiment.

FIG. 6 illustrates a structure of a resistive memory device according to an exemplary embodiment.

A resistive memory device 100 illustrated in FIG. 6 may include a data storage node 101 lower electrode 103, and an upper electrode 105.

The data storage node 101 may include variable resistive material layers 1012, 1014, and 1016 that are alternately with insulating layers 1011, 1013, 1015, and 1017. The lower electrode 103 is formed adjacent to the insulating layers 1011, 1013, 1015, and 1017 and the variable resistive material layers 1012, 1014, and 1016, and surrounds one sidewall of the data storage node 101. The upper electrode 105 is formed adjacent to the insulating layers 1011, 1013, 1015, and 1017 and the variable resistive material layers 1012, 1014, and 1016, and surrounds another sidewall of the data storage node 101.

The reference numerals 107 and 109 denote interlayer insulating layers.

In the resistive memory device 100 illustrated in FIG. 6, at least one layer of the variable resistive material layers 1012, 1014, and 1016 constituting the data storage node 101 may include a chalcogenide compound containing about 10 to about 60 wt % Se or Te. The variable resistive material layers 1012, 1014, and 1016 may be formed of the same material or of different materials. In any case, at least one layer is formed of the chalcogenide compound.

In the exemplary resistive memory device having the above-described structure, when a characteristic, such as a type, a level, or a period of time, of a pulse applied in a program operation is controlled, a crystalline state of the variable resistive material layers 1012, 1014, and 1016 is changed to three or more states or more to implement the MLC-type resistive memory device. Further, when the variable resistive material layers 1012, 1014, and 1016 are formed of materials having different crystallization characteristics, the variable resistive material layers 1012, 1014, and 1016 implements the MLC-type resistive memory device under the same pulse characteristics.

Figure 7:
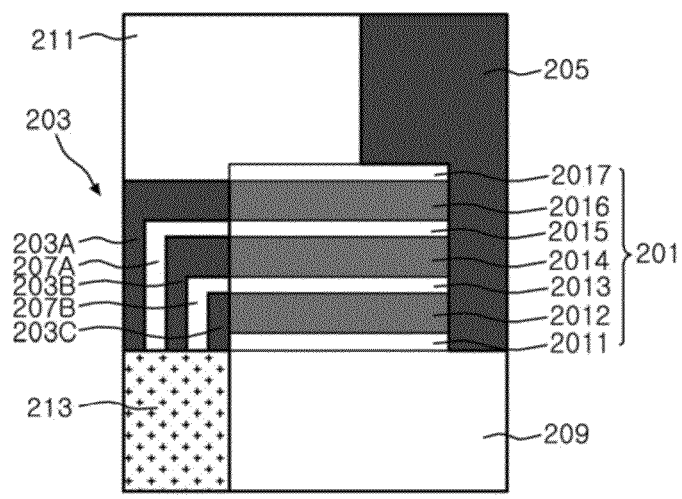
FIG. 7 illustrates a structure of a resistive memory device according to an exemplary embodiment.

FIG. 7 is a view illustrating a structure of a resistive memory device according to another exemplary embodiment.

Referring to FIG. 7, a resistive memory device 200 according to an exemplary embodiment may include a data storage node 201, a lower electrode 203, and an upper electrode 205.

The data storage node 201 may include variable resistive material layers 2012, 2014, and 2016 that are alternately stacked with insulating layers 2011, 2013, 2015, and 2017 being interposed therebetween. The lower electrode 203 is formed to be electrically connected, via one sidewall of the data storage node 201, to the variable resistive material layers 2012, 2014, and 2016. The upper electrode 205 is formed to surround the variable resistive material layers 2012, 2014, and 2016 and the insulating layers 2011, 2013, 2015, and 2017 at the other sidewall of the storage node 201.

In the exemplary embodiment, the lower electrode 203 is connected to the variable resistive material layers 2012, 2014, and 2016 via the one sidewall of the data storage node 201. The insulating layers 2013 and 2015, which are interposed between the variable resistive material layers 2012, 2014, and 2016, are not in contact with the lower electrode 203 and insulated by interlayer insulating layers 207A and 207B. The reference numerals 209 and 211 denote interlayer insulating layers.

The lower electrode 203 may include three lower electrodes 203A, 203B, and 203C, which may be connected to a common electrode 213.

In the exemplary resistive memory device 200, illustrated in FIG. 7, at least one layer of the variable resistive material layers 2012, 2014, and 2016 constituting the data storage node 201 may include the above-discussed chalcogenide compound. Although the variable resistive material layers 2012, 2014, and 2016 may be formed of the same material as or different materials from each other, at least one layer has to be formed of the above-discussed chalcogenide compound containing about 10 to about 60 wt % Se or Te.

Further, in an exemplary embodiment, the lower electrodes 203A, 203B, and 203C, which are connected to the respective variable resistive material layer 2012, 2014, and 2016, may be formed of materials that have the same resistance or different resistances.

When the lower electrodes 203A 203B and 203C are formed of the materials having different resistances, a current amount provided to the variable resistive material layer 2012, 2014, and 2016 can be controlled to implement the MLC-type resistive memory device. Alternatively, the exemplary variable resistive material layers 2012, 2014, and 2014 may be formed of the same material. Even when the lower electrodes 203A, 203B, and 203C are formed of the same material, a pulse characteristic, such as a period of time applied, a level, or a type, may be controlled to implement the MLC-type resistive memory device.

Figure 8:
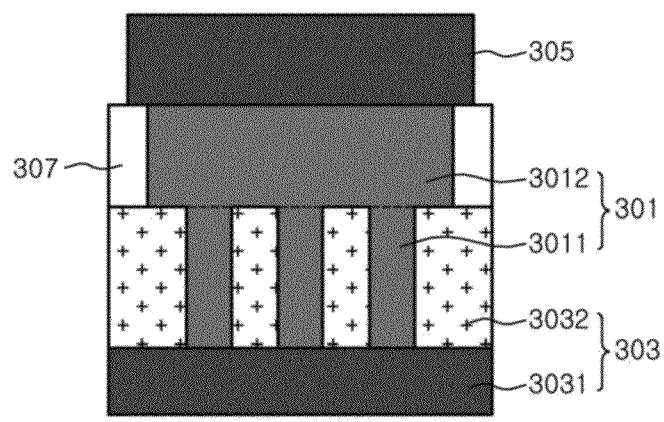
FIG. 8 illustrates a structure of a resistive memory device according to an exemplary embodiment.

FIG. 8 illustrates a structure of a resistive memory device according to an exemplary embodiment.

A resistive memory device 300 illustrated in FIG. 8 may include a data storage node 301, a lower electrode 303, and an upper electrode 305.

The lower electrode 303 may include a first lower electrode 3031 connected to an access device (not shown) and a second lower electrode 3032 including at least one via hole form on the first lower electrode 3031 at preset intervals.

The data storage node 301 may include a first variable material layer 3011 buried in the at least one via hole formed in the second lower electrode 3032 and a second variable resistive material layer 3012 formed on the second lower electrode 3032 and the first variable resistive material layer 3011.

The upper electrode 305 is formed on the second variable resistive material layer 3012.

A resistive memory device, having a confined structure, proposed in recent years has a poor interface characteristic between the lower electrode and the variable resistive material layer which may cause lifting and subsequently failure.

However, in an exemplary embodiment, as shown in FIG. 8, the first variable resistive material layer 3011 is buried in the via hole formed in the second lower electrode 3032, and the second variable resistive material layer 3012 is electrically connected to the second lower electrode 3032 and the first variable resistive material layer 3011, so that lifting between the lower electrode 303 and the data storage node 301 can be prevented. Thus, an interface characteristic can be stable.

In an exemplary embodiment, the first and second lower electrodes 3031 and 3032 may be formed of the same material or of different materials from each other. Further, the first and second variable resistive material layers 3011 and 3012, which constitute the data storage node 301, may be formed of the same material or of different materials from each other. At least one layer, of the variable resistive material layers 3011 and 3012 is formed, of a chalcogenide compound containing about 10 to about 60 wt % Se or Te.

The MLC-type resistive memory device may be implemented by changing only the crystalline state of the first variable resistive material layer 3011, by changing only the crystalline state of the second variable resistive material layer 3012, or by changing the crystalline states of the first and second variable resistive material layers 3011 and 3012.

Figure 9:
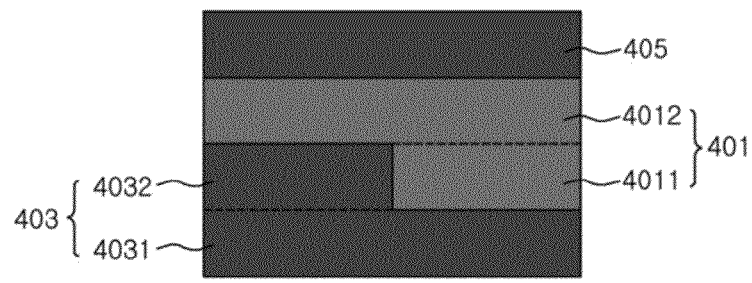
FIG. 9 illustrates a structure of a resistive memory device according to an exemplary embodiment.

FIG. 9 illustrates a structure of a resistive memory device 400 according to an exemplary embodiment.

Referring to FIG. 9, an exemplary resistive memory device may include a first lower electrode 4031, a second lower electrode 4032 formed on a periphery of the first lower electrode 4031 to have a preset width and height. A first variable resistive material layer 4011 is buried adjacent to the second lower electrode 4032 and a second variable resistive material layer 4012 is formed on, and electrically connected to, the second lower electrode 4032 and the first variable resistive material layer 4011. An upper electrode 405 is formed on the second variable resistive material layer 4012. The first and second variable resistive material layers 4011 and 4012 constitute a data storage node 401. The first and second lower electrodes 4031 and 4032 constitute a lower electrode 403.

In FIG. 9, the first lower electrode 4031 and the second lower electrode 4032 may be formed of the same material or of different materials. Further, the first variable resistive material layer 4011 and the second variable resistive material layer 4012 may be formed of the same material or of different materials. At least one layer of the first and second variable resistive material layers 4011 and 4012 is formed of a chalcogenide compound containing about 10 to about 60 wt % of Se or Te.

When the first lower electrode 4031 and the second lower electrode 4032 are formed of different materials, the first lower electrode 4031 and the second lower electrode and 4032 may have different resistance values. Thus the MLC-type resistive memory device can be implemented by changing the crystalline state of the data storage node 401.

Even when the first lower electrode 4031 and the second lower electrode 4032 are formed of the same material, and the first variable resistive material layer 4011 and the second variable resistive material layer 4012 are formed of the same material, the MLC-type resistive memory device can be also implemented based on a characteristic, such as a period of time applied, a level, or a type, the program pulse.

Although not shown, the lower electrodes of the exemplary resistive memory devices, illustrated in FIGS. 6 to 9, can be connected to an access device and the upper electrodes can be connected to a bit line.

Figure 10:
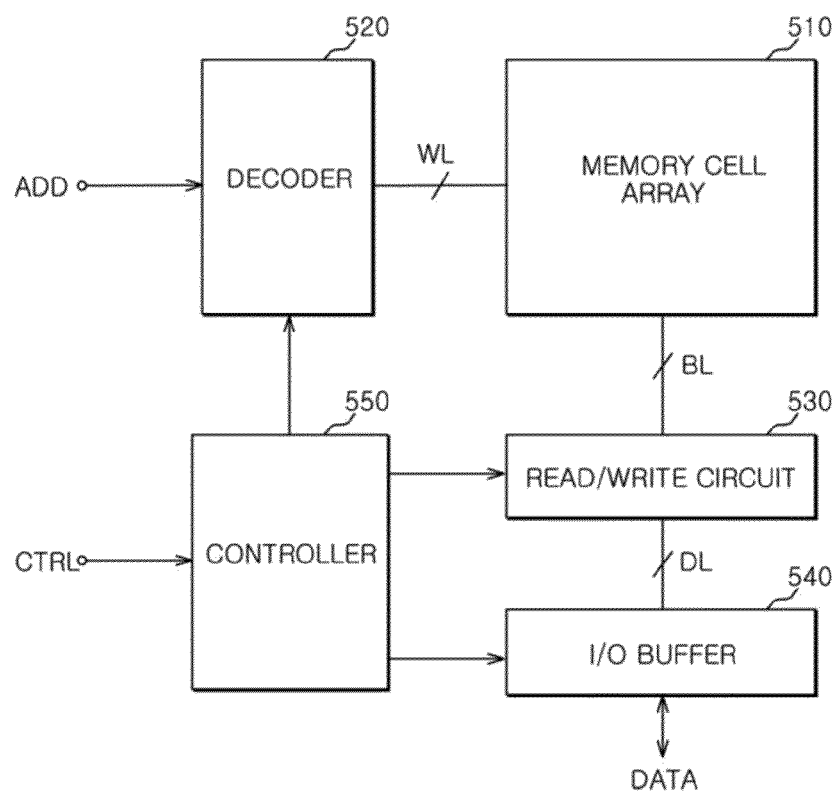
FIG. 10 illustrates a configuration of a memory apparatus according to an exemplary embodiment.

FIG. 10 illustrates an exemplary configuration of a memory apparatus.

Referring to FIG. 10, an exemplary memory apparatus 500 may include a memory cell array 510, including a plurality of memory cells, a decoder 520, a read/write circuit 530 an input/output (I/O) buffer 540, and a controller 550.

Each of the plurality of memory cells may be configured to include any one of the exemplary resistive memory devices illustrated in FIGS. 6 to 9. Further, the plurality of memory cells in the memory cell array 510 is connected to the decoder 520 through a word line WL and to the read/write circuit 530 through a bit line BL.

The decoder 520 receives an external address ADD and decodes a row address and a column address to be accessed in the memory cell array 510 by control of the controller 550 which operates according to a control signal CTRL.

The read/write circuit 530 receives data DATA from the I/O buffer 540, and writes data in a selected memory cell of the memory cell array 510 under control of the controller 550 or provides data read from a selected memory cell of the memory cell array 510 to the I/O buffer 540 under control of the controller 550.

Since the chalcogenide compound containing about 10 to about 60 wt % of Se or Te is used as the data storage node in the resistive memory device constituting the memory cell array 510, the memory apparatus 500 operates with a lower power consumption, as compared with a general resistive memory device.

Figure 11:
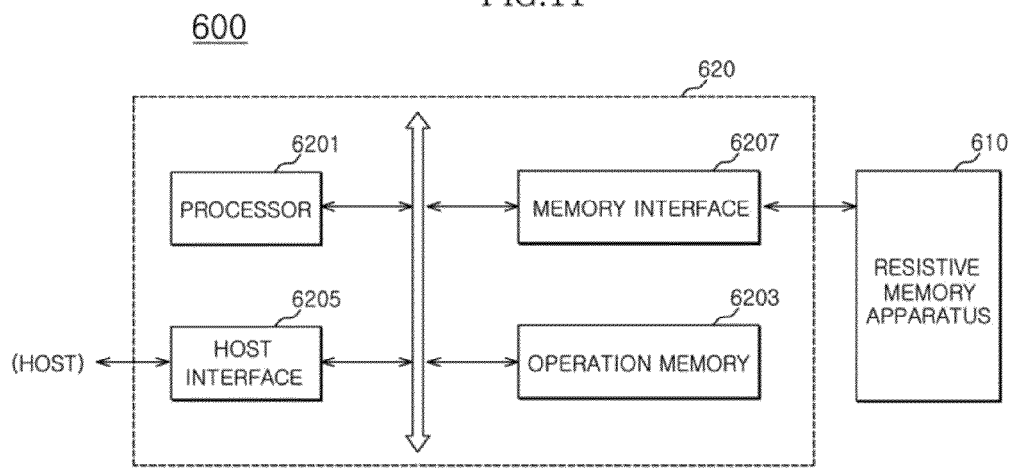
FIG. 11 illustrates a configuration of a data processing system according to an exemplary embodiment.

FIG. 11 illustrates an exemplary configuration of a data processing system.

A data processing system 600 illustrated in FIG. 11 may include a memory controller 620 connected between a host and a resistive memory apparatus 610.

The memory controller 620 may be configured to access the resistive memory apparatus 610 in response to request of the host. Thus, the memory controller 620 may include a processor 6201, an operation memory 6203, the host interface 6205, and a memory interface 6207.

The processor 6201 may control an overall operation of the memory controller 620, and the operation 6203 memory may store an application, data, control signal, or any other feature required for operation of the memory controller 620.

The host interface 6205 performs protocol conversion for exchange of data/control signal between the host and the memory controller 620. The memory interface 6207 performs protocol conversion for exchange of data/control signal between the memory controller 620 and the resistive memory apparatus 610.

The resistive memory apparatus 610 may include a memory cell array configured of memory devices using the exemplary variable resistive material containing about 10 to about 60 wt % of Se or Te of, as the data storage node.

In an exemplary configuration of a data processing system, the data processing system, illustrated in FIG. 11, may be a memory card, but the data processing system, is not limited thereto.

Figure 12:
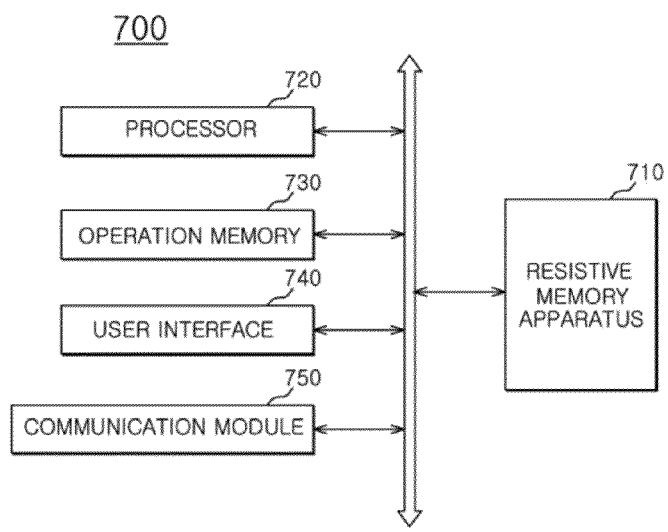
FIG. 12 illustrates a configuration of a data processing system according to an exemplary embodiment.

FIG. 12 illustrates an exemplary configuration of a data processing system.

A data processing system 700, illustrated in FIG. 12, may include a resistive memory apparatus 710, a processor 720, an operation memory 730, and a user interface 740. If necessary, the data processing system 700 may further include a communication module 750.

The processor 720 may be a central processing unit (CPU) and the operation memory 730 may store an application program, data, control signal, and the like required for an operation of the data processing system 700. The user interface 740 provides an environment accessible to the data processing system 700 by the user and provides a data processing procedure, result, and the like to the user.

The resistive memory apparatus 710 may include a memory cell array including memory devices using the variable resistive material containing about 10 to about 60 wt % of Se or Te, as the data storage node.

On the other hand, the data processing systems illustrated in FIGS. 11 and 12 may be used as a disc apparatus, a built/external memory card of a mobile electronic apparatus, an image processor, or other application chipsets.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A memory device, comprising:
    a lower electrode to be electrically connected an access device;
    a data storage node, including a variable resistive material layer, to be heated by the lower electrode, the variable resistive material layer comprising a chalcogenide compound comprising 10 to 60 wt % (atomic weight) of selenium (Se) or tellurium (Te); and
    an upper electrode connected to the data storage node,
    wherein the chalcogenide compound comprises a material selected from the group consisting of (i) a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %, (ii) a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %, (iii) a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %, and (iv) a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

2. A resistive memory device, comprising:
    a data storage node including variable resistive material layers alternately stacked with insulating layers, wherein one of the variable resistive material layers is formed of a chalcogenide compound comprising 10 to 60 wt % (atomic weight) of selenium (Se) or tellurium (Te);
    a lower electrode surrounding the insulating layers and the variable resistive material layers at one sidewall of the data storage node; and
    an upper electrode surrounding the insulating layers and the variable resistive material layers at another sidewall of the data storage node.

3. The resistive memory device of claim 2, wherein the chalcogenide compound further comprises:
    one of antimony (Sb), germanium (Ge), silicon (Si), tin (Sn), and indium (in), in combination with the Se or the Te.

4. The resistive memory device of claim 2, wherein the chalcogenide compound further comprises:
    at least two of antimony (Sb), germanium (Ge), silicon (Si), tin (Sn), and indium (In), in combination with the Se or the Te.

5. The resistive memory device of claim 2, wherein the chalcogenide compound further comprises:
    a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %.

6. The resistive memory device of claim 4, wherein the chalcogenide compound further comprises:
    a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %.

7. The resistive memory device of claim 2, wherein the chalcogenide compound further comprises:
    a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %.

8. The resistive memory device of claim 2, wherein the chalcogenide compound further comprises:
    a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

9. The resistive memory device of claim 2, wherein the variable resistive material layers are formed of the same material or of different materials.

10. A memory device, comprising:
a data storage node including variable resistive material layers alternately stacked with insulating layers, wherein one of the variable resistive material layers is formed of a chalcogenide compound comprising 10 to 60 wt % (atomic weight) of selenium (Se) or tellurium (Te);
a lower electrode electrically connected to the variable resistive material layers at one sidewall of the data storage node; and
an upper electrode formed to surrounding the insulating layers and the variable resistive material layers in another sidewall of the data storage node.

11. The memory device of claim 10, wherein the chalcogenide compound further comprises:
one of antimony (Sb), germanium (Ge), silicon (Si), tin (Sn), and indium (in), in combination with the Se or the Te.

12. The memory device of claim 10, wherein the chalcogenide compound further comprises:
at least two of antimony (Sb), germanium (Ge), silicon (Si), tin (Sn), and indium (In), in combination with the Se or the Te.

13. The memory device of claim 10, wherein the chalcogenide compound further comprises:
a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %.

14. The memory device of claim 10, wherein the chalcogenide compound further comprises:
a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %.

15. The memory device of claim 10, wherein the chalcogenide compound further comprises:
a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %.

16. The memory device of claim 10, wherein the chalcogenide compound further comprises:
a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

17. The memory device of claim 10, wherein the variable resistive material layers are formed of the same material or of different materials.

18. The memory device of claim 10, wherein the lower electrode is electrically connected to the variable resistive material layers and the variable resistive material layers are formed of the same material or of different materials.

19. A resistive memory device, comprising:
a first lower electrode;
a second lower electrode formed on the first lower electrode, the second lower electrode including a via hole exposing the lower electrode;
a first variable resistive material layer buried in the via hole;
a second variable resistive material layer formed on the second lower electrode and on the first variable resistive material layer; and
an upper electrode formed on the second variable resistive material layer,
wherein the first variable resistive material layer or the second variable resistive material layer is formed of a chalcogenide compound comprising 10 to 60 wt % (atomic weight) of selenium (Se) or tellurium (Te).

20. The resistive memory device of claim 19, wherein the chalcogenide compound further comprises:
one of antimony (Sb), germanium (Ge), silicon (Si), tin (Sn), and indium (in), in combination with the Se or the Te.

21. The resistive memory device of claim 19, wherein the chalcogenide compound further comprises:
at least two of antimony (Sb), germanium (Ge), silicon (Si), tin (Sn), and indium (In), in combination with the Se or the Te.

22. The resistive memory device of claim 19, wherein the chalcogenide compound further comprises:
a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %.

23. The resistive memory device of claim 19, wherein the chalcogenide compound further comprises:
a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %.

24. The resistive memory device of claim 19, wherein the chalcogenide compound further comprises:
a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %.

25. The resistive memory device of claim 19, wherein the chalcogenide compound further comprises:
a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

26. The resistive memory device of claim 19, wherein the first variable resistive material layer and the second variable resistive material layer are formed of the same material or of different materials.

27. The resistive memory device of claim 19, wherein the first lower electrode and the second lower electrode are formed of the same material or of different materials.

28. A resistive memory device, comprising:
a first lower electrode;
a second lower electrode formed on a periphery of the first lower electrode;
a first variable resistive material layer buried in an inner circumference of the second lower electrode;
a second variable resistive material layer formed on the second lower electrode and the first variable resistive material layer to be electrically connected to the second lower electrode and the first variable resistive material layer; and
an upper electrode formed on the second variable resistive material layer,
wherein the first variable resistive material layer or the second variable resistive material layer is foil red of a chalcogenide compound comprising 10 to 60 wt % (atomic weight) of selenium (Se) or tellurium (Te).

29. The resistive memory device of claim 28, wherein the chalcogenide compound further comprises:

one of antimony (Sb), germanium (Ge), silicon (Si), tin (Sn), and indium (in), in combination with the Se or the Te.

30. The resistive memory device of claim 28, wherein the chalcogenide compound further comprises:
   at least two of antimony (Sb), germanium (Ge), silicon (Si), tin (Sn), and indium (In), in combination with the Se or the Te.

31. The resistive memory device of claim 28, wherein the chalcogenide compound further comprises:
   a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %.

32. The resistive memory device of claim 28, wherein the chalcogenide compound further comprises:
   a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %.

33. The resistive memory device of claim 28, wherein the chalcogenide compound further comprises:
   a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %.

34. The resistive memory device of claim 28, wherein the chalcogenide compound further comprises:
   a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

35. The resistive memory device of claim 28, wherein the first variable resistive material layer and the second variable resistive material layer are formed of the same material or of different materials.

36. The resistive memory device of claim 28, wherein the first lower electrode and the second lower electrode are formed of the same material or of different materials.

37. A memory apparatus, comprising:
   a memory cell array, including a plurality of memory cells, connected between a word line and a bit line; and
   a controller, connected to the memory cell array, to control data reading and writing for the memory cell array,
   wherein each of the plurality of memory cells includes a resistive memory device including a variable resistive material layer formed of a chalcogenide compound comprising 10 to 60 wt % (atomic weight) of selenium (Se) or tellurium (Te),
   wherein the chalcogenide compound comprises a material selected from the group consisting of (i) a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %, (ii) a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %, (iii) a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %, and (iv) a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

38. A data processing system, comprising:
   a resistive memory apparatus including a memory cell array in which resistive memory devices are connected between bit lines and word lines;
   a memory controller to access the resistive memory apparatus in response to request of a host; and
   a controller to control an operation of the memory cell array,
   wherein each of the resistive memory devices is a resistive memory device including a variable resistive material layer formed of a chalcogenide compound comprising 10 to 60 wt % (atomic weight) of selenium (Se) or tellurium (Te),
   wherein the chalcogenide compound comprises a material selected from the group consisting of (i) a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %, (ii) a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %, (iii) a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %, and (iv) a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

39. A data processing system, comprising:
   a processor;
   a memory storing data for use by the processor;
   a resistive memory apparatus connected to the processor, wherein the resistive memory apparatus includes a memory cell array in which resistive memory devices are connected between bit lines and word lines;
   a user interface to input data and output data between the processor and a user; and
   a controller to control an operation of the memory cell array,
   wherein each of the resistive memory devices is a resistive memory device including a variable resistive material layer formed of a chalcogenide compound comprising 10 to 60 wt % (atomic weight) of selenium (Se) or tellurium (Te),
   wherein the chalcogenide compound comprises a material selected from the group consisting of (i) a tin-antimony-selenium (Sn—Sb—Se) compound, wherein an amount of the Sn is 1.0 to 25.5 wt %, an amount of the Sb is 10 to 90 wt %, and an amount of the Se is 10 to 60 wt %, (ii) a germanium-antimony-selenium (Ge—Sb—Se) compound, wherein an amount of the Ge is 1.0 to 25.5 wt %, an amount of the Sb is 10 to 90 wt %, and an amount of the Se is 10 to 60 wt %, (iii) a tin-antimony-tellurium (Sn—Sb—Te) compound, wherein an amount of the Sn is 1.0 to 25.5 wt %, an amount of the Sb is 10 to 90 wt %, and an amount of the Te is 10 to 60 wt %, and (iv) a silicon-antimony-tellurium (Si—Sb—Te) compound, wherein an amount of the Si is 1.0 to 25.5 wt %, an amount of the Sb is 10 to 90 wt %, and an amount of the Te is 10 to 60 wt %.

* * * * *

UNITED STATES PATENT AND TRADEMARK OFFICE
CERTIFICATE OF CORRECTION

PATENT NO. : 8,982,604 B2  
APPLICATION NO. : 13/746625  
DATED : March 17, 2015  
INVENTOR(S) : Keun Lee et al.

Page 1 of 1

It is certified that error appears in the above-identified patent and that said Letters Patent is hereby corrected as shown below:

On the Title Page,

Change Item (56) the Foreign Patent Documents section as follows:

| --KR | 100687757 | 2/2007 |
| KR | 100858089 | 9/2008 |
| KR | 1020100041139 | 4/2010 |
| KR | 1020100137577 | 12/2010 |
| KR | 1020110022249 | 3/2011--. |

Signed and Sealed this  
Fourteenth Day of July, 2015

Michelle K. Lee  
*Director of the United States Patent and Trademark Office*